United States Patent [19]

Wiese

[11] Patent Number: 5,723,363
[45] Date of Patent: Mar. 3, 1998

[54] METHOD OF MANUFACTURING A SEMICONDUCTOR DEVICE

[75] Inventor: Lynn Wiese, Santa Clara, Calif.

[73] Assignee: Siemens Components, Inc., Cupertino, Calif.

[21] Appl. No.: 537,062

[22] Filed: Sep. 29, 1995

[51] Int. Cl.$^6$ ................................................ H01L 21/60
[52] U.S. Cl. ..................... 437/205; 437/3; 437/205; 437/215; 437/217
[58] Field of Search ................... 437/2, 3, 5, 205, 437/209, 211, 214, 215, 217, 218, 219, 220

[56] References Cited

U.S. PATENT DOCUMENTS

| | | | |
|---|---|---|---|
| 5,032,542 | 7/1991 | Kazami et al. | 437/220 |
| 5,096,852 | 3/1992 | Hobson | 437/220 |
| 5,389,578 | 2/1995 | Hopson et al. | 437/205 |
| 5,472,915 | 12/1995 | Schairer et al. | 437/209 |

FOREIGN PATENT DOCUMENTS 54-157489  12/1979  Japan .................. 437/206

*Primary Examiner*—Kevin Picardat

[57] ABSTRACT

A method of making a data access arrangement (DAA) device. The method includes providing a substrate with a DAA circuit, containing optically active electrical components, mounted on it and individually encapsulating each optically active component with an optical medium. An opaque material is transfer molded about the substrate to completely encase the substrate and all of the circuit components. Before the transfer molding, a lead frame is attached to the substrate that extends through and beyond the opaque material to enable electrical contact with the substrate and the circuit components.

16 Claims, 2 Drawing Sheets

METHOD OF MANUFACTURING A SEMICONDUCTOR DEVICE

FIELD OF THE INVENTION

This invention generally relates to telephone line communications. Specifically, the invention relates to a method of making a coupling device for telephone subscriber equipment known as a data access arrangement or DAA.

BACKGROUND OF THE INVENTION

Telephone signals are provided to subscribers (customers) through the public switched telephone network. Necessarily, any terminal equipment connected to this network by or for a subscriber must meet certain specifications in order to function properly.

To connect subscriber equipment such as data modems, facsimile machines, (non-cellular) portable telephones, speaker telephones, message answering machines, etc. to the analog public switched telephone network, one must provide an interface or data access arrangement to bridge any incompatibilities between the network and the subscriber equipment. In addition to complying with network protocols, since subscriber equipment are typically four-wire devices with separate transmit and receive pairs, the interface must separate the analog signals on the network into discrete transmit and receive signals (and vice versa). Finally, the interface must electrically isolate the telephone network from the subscriber equipment.

Isolation line transformers have historically been used in DAA circuits to provide the required separation between the network and the subscriber. However, such transformers are physically large, heavy and costly and, thus, are not well-suited for applications requiring the interface to have minimal volume and weight (e.g., small portable computers and data entry devices). In such reduced volume/weight applications, a substitute such as optical couplers (optocouplers), must be used to provide the requisite function.

Optocouplers are formed of a light emitter, typically an infrared light emitting diode, and a photodetector. The emitter and photodetector are mounted on a lead frame side-by-side, or vertically facing one another on a jogged lead frame. In a hybrid DAA circuit, typically, a plurality of optocouplers are mounted on a substrate along with a variety of discrete components and integrated circuits that they connect to in the circuit.

Although optocouplers provide a DAA with a smaller profile and reduced weight, they also present certain difficulties. First, the smaller profile of the DAA circuit on the substrate may adversely affect the DAA function of providing electrical isolation between the network and the subscriber equipment. Such isolation may be difficult to accomplish when the optocouplers of the DAA circuit are physically located close to one another. Second, severe components testing, such as pressure-cooker tests, used in quality assurance evaluations may damage the components. In a typical quality assurance test, a DAA is placed in a pressure-cooker for 24 hours at approximately 120° C. and 2 atmospheres and then checked to see if it remains functional. If the circuit board of the DAA becomes exposed during such tests, water may migrate to the inside of the optocouplers or other components and create an arc path, causing the DAA to fail electronically.

In part to protect against environmental conditions, circuit boards are often covered with an encapsulating material on the circuit side of the substrate. Such a circuit board, however, is not completely sealed to the outside environment, and is still susceptible to the damage discussed above that occurs during quality assurance tests. This damage is caused by penetration of fluids between the substrate and the encapsulating material or through the substrate. In addition, electrical connections on these boards are typically formed by solder bumps on the uncovered side of the circuit substrate. Such connections are difficult to use because they cannot be seen when the circuit board is viewed from the encapsulated side.

SUMMARY OF THE INVENTION

Briefly, the present invention provides an improved method of making a semiconductor device, such as a DAA. The method comprises a) mounting an optically-active component on a substrate; b) encapsulating the optically-active component with a radiation-transmissive material to form an optical medium; and c) encapsulating the substrate with an opaque material so that the substrate and the component are sealed from the outside environment.

The method may also include the step of coating the radiation-transmissive material with radiation-reflective material. Encapsulating the optically-active component and coating the radiation-transmissive material may be carried out before the optically-active component is mounted on the substrate.

The method may further include the step of attaching an electrical connection to the substrate before encapsulating the substrate such that the electrical connection extends through the opaque material.

Also, the substrate may be encapsulating by overmolding the opaque material around the substrate, such as by transfer molding.

Advantageously, by individually encasing the optically-active components and encasing the entire semiconductor device, a totally isolated and sealed circuit, such as a DAA, is provided with a substrate that is totally configurable. The resulting device is also resistant to the environment outside the circuit and shows better results, compared to substrates molded only on one side, after quality assurance tests, such as pressure-cooker tests.

BRIEF DESCRIPTION OF THE DRAWINGS

For a better understanding of the invention, reference is made to the following description of an exemplary embodiment thereof, and to the accompanying drawings, wherein.

DETAILED DESCRIPTION

Figure 1:
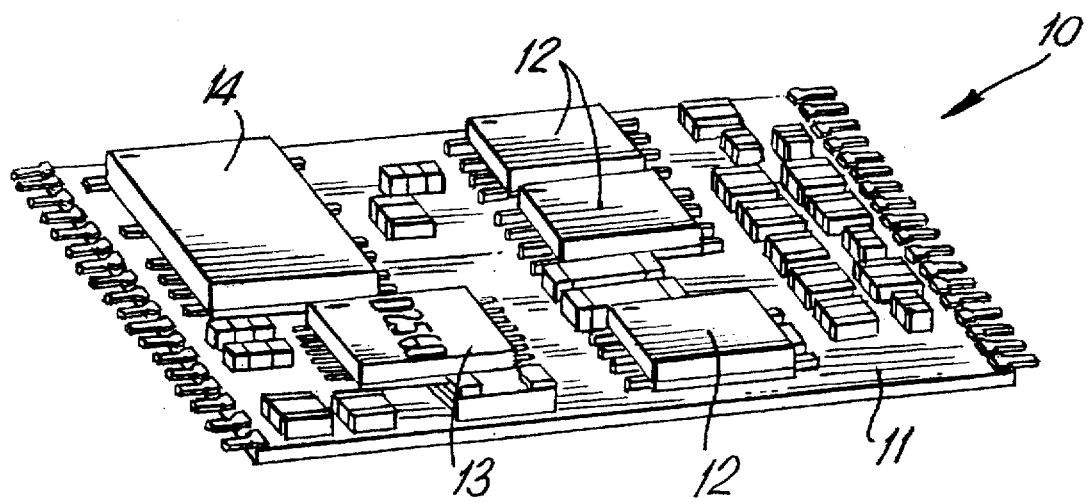
FIG. 1 is a perspective view of a DAA circuit used in an exemplary embodiment of the present invention.
Figure 2:
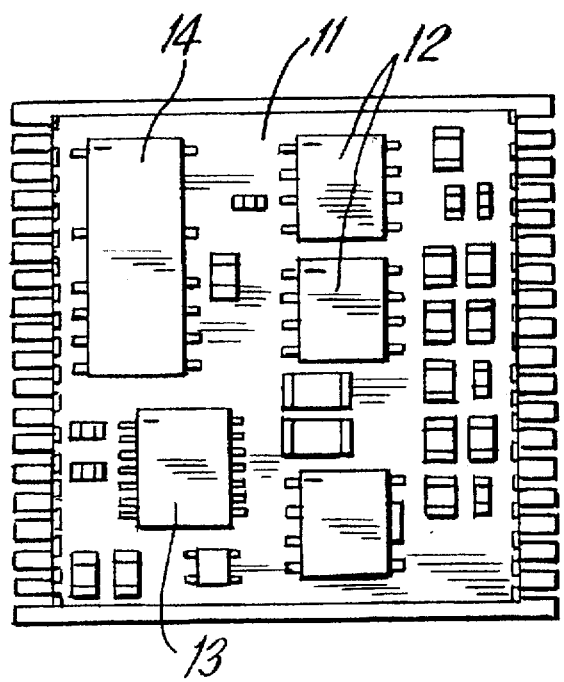
FIG. 2 is a top view of the DAA circuit shown in FIG. 1.

FIGS. 1 and 2 are perspective and top views, respectively, of an exemplary DAA circuit 10 for use in the present invention. The DAA circuit 10 comprises a circuit board or substrate 11 that has a variety of electrical components mounted on it, such as optocouplers 12, an integrated circuit 13, and a packaged integrated circuit and optocoupler 14. These components may, for example, be built directly on the substrate 11 or soldered onto the substrate 11 or a combination thereof. Also, the components may, for example, be pre-packaged or chip-on-board components or a combination thereof. In addition, any combination of known components useful in a DAA may be used, including line transformers. Further, although the DAA circuit 10 is a hybrid circuit in the exemplary embodiment, any DAA circuit 10 known in the art may be used.

Figure 3:
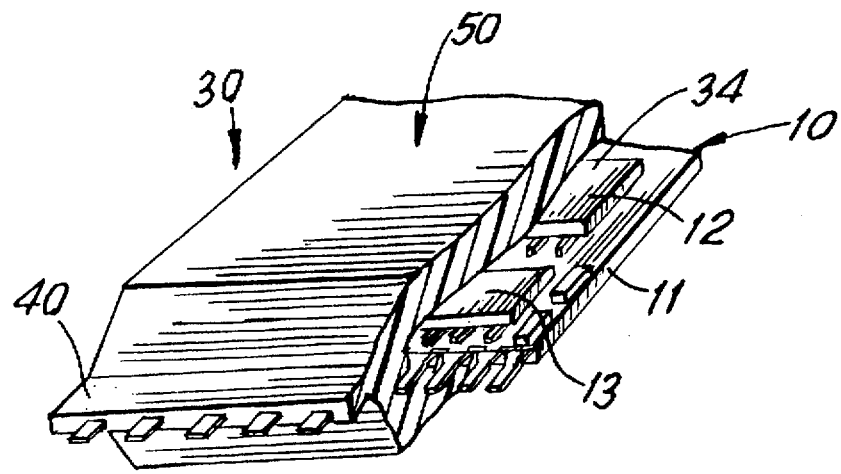
FIG. 3 is a partially cut-away perspective view of a DAA constructed in accordance with the present invention.
Figure 4:
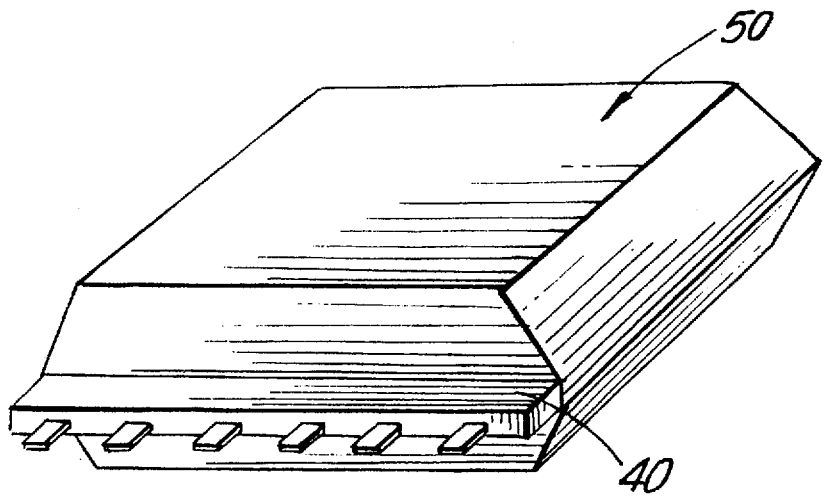
FIG. 4 is a perspective view of the DAA shown in FIG. 3.
Figure 5:
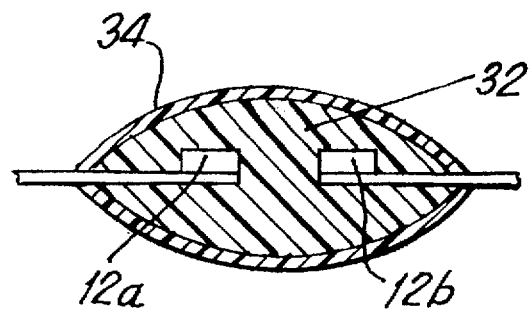
FIG. 5 is a schematic representation of an optocoupler used in an exemplary embodiment of the present invention.

FIGS. 3 and 4 show a partially cut-away perspective view of a DAA 30 constructed in accordance with the present invention and a full perspective view of the DAA 30, showing its final form, respectively. The DAA 30 comprises the DAA circuit 10 with the components 12, 13, 14 mounted on the substrate 11, for example, as shown above. The optically-active components, such as optocoupler 12, are "pre-made", i.e., the component elements, such as the photo-emitters 12a or photodetectors 12b, are exposed without a surrounding shell or package (see FIG. 5). These "pre-made" components are individually encapsulated with a light conducting material 32, such as clear silicone resin or clear epoxy. The encapsulating material 32 forms the optical medium for each component.

Depending upon the mechanical design of the component elements, the encapsulating material 32 may also be covered or painted with a light reflective material 34 that acts as a mirror for the optical medium. The light reflective material 34 prevents any light from the operation of the component elements from being absorbed, and thus "lost", by any material surrounding the component elements, e.g., packaging or a cover. The light reflective material 34 may be formed from white silicone or epoxy; preferably, the material/composition of the light reflective material 34 should match the material/composition of the light conducting material 32 in order not to present different surfaces for the optical transmissions and thus prevent variations.

Once these components are encapsulated, they are typically tested and categorized before mounting on the substrate 11 and connected in the circuit 10. The encapsulated components may be mounted on the substrate 11 with the remainder of the circuit components in any conventional manner, e.g., soldering, as indicated above. Alternatively, any "pre-made" optically-active component may be first mounted on the substrate 11 before encapsulation with the optical medium 32, 34.

Each individual optical medium 32, 34 may conduct and operate with any type of radiation used by the particular component, for example, infrared radiation. Once the components 12, 13, 14 are mounted on the substrate 11, a lead frame 40 is mechanically connected to the sides of the substrate 11 in any conventional manner and electrically connected to the respective circuit 10 components in any conventional manner. The lead frame 40 provides the electrical connection between DAA circuit 10 and the outside environment. The performance characteristics of the DAA circuit 10 and the various components 12, 13, 14 may be adjusted and calibrated according to specification before and after the attachment of the lead frame 40.

Thereafter, the substrate 11 is encapsulated with an opaque material or cover 50 so that the substrate 11 and the components 12, 13, 14 mounted thereon are sealed to the outside environment. Further, each component 12, 13, 14 mounted on the substrate 11 is completely isolated from every other component. The lead frame 40 extends through the opaque cover 50 to permit electrical connection between the DAA circuit 10 and the outside environment. Besides acting as the packaging for the DAA circuit 10, the opaque cover 50 acts as a barrier to the outside environment preventing external moisture and light from penetrating the DAA 30 and interfering with the operation of the optocouplers 12 and other components. The opaque cover 50 may be formed from any opaque epoxy resin.

The opaque material 50 may be applied around the substrate 11 by transfer molding in which case the opaque material 50 may specifically be a transfer molding compound. In transfer molding, the substrate 11 is located inside a metal mold which has recesses that define the shape and final form of the cover 50. The encapsulating material 50, usually a thermosetting material, is forced into the mold cavity at high temperatures and high pressures so as to liquify and flow to fill the mold cavity. The material 50 is then cured and the molded assembly 30 is removed from the mold.

The transfer molding compound should have a very high flow because it must cover relatively large, flat surfaces without producing voids. Suitable exemplary molding compounds include Plaskon® SMT-B-1, Plaskon® LS16S, and Plaskon® ULS-12, available from Plaskon Electronic Material (a Rohm & Hass Company), Philadelphia, Pa., and the MP-8000 series of molding compounds available from Nitto Denko Corporation, Kameyama, Mie, Japan.

The material used for the substrate 11 should have a coefficient of expansion that matches that of the material for the cover 50. The solder used to mount the optocouplers 12 and other components on the substrate 11 should not melt during encapsulation of the substrate 11. For example, the temperature in transfer molding is typically approximately at the melt point of 60/40 solder; therefore, a high temperature solder should be used. Such a high temperature solder should also have traces of indium in it to prevent fatigue. During transfer molding, the DAA circuit 10 is tightly constrained, being cast in the molding compound and subjected to shear force. It is therefore important not to damage the DAA circuit 10 during the molding process.

By forming the cover 50 on both sides of the DAA circuit 10, the DAA circuit 10 is completely enclosed and protected from the environment. A double-sided molded DAA 30 yields better results and environmental resistance than other single-sided molded devices. Also, by individually encapsulating the optically-active components and encasing the entire circuit 10 as well as the individual mounted components, a totally isolated and sealed circuit is provided.

The embodiments described herein are merely illustrative of the principles of the present invention. Various modifications may be made thereto by persons ordinarily skilled in the art, without departing from the scope or spirit of the invention.

For example, the opaque material 50 may be applied around the substrate 11 by any "overmolding" operation other than transfer molding, e.g., injection molding, pour molding, "glob-top" process, reaction-injection molding (RIM), etc. The opaque material 50 may then be any material appropriate for the operation, such as thermoplastic material, etc.

Further, the opaque material 50 may be applied around the substrate 11 by casting or coating liquid opaque epoxy around the entire substrate 11 and mounted components 12, 13, 14. This obtains higher breakdown voltage for the DAA 30 and is less costly.

What is claimed is:

1. A method of making a semiconductor device, comprising the steps of:

a. mounting plural optically active components on substrate;

b. encapsulating each optically active component with a radiation-transmissive material to form an optical medium; and c. encapsulating the substrate with an opaque material disposed around the substrate and each encapsulated optically active component, said opaque material sealing the substrate and the components from the outside environment so that light is not emitted to or received from said outside environment.

2. The method of claim 1, further comprising the step of coating the radiation-transmissive material with radiation-reflective material.

3. The method of claim 2, wherein the steps of encapsulating the optically active component and coating the radiation-transmissive material are carried out before the optically active component is mounted on the substrate.

4. The method of claim 1, further comprising the step of attaching an electrical connection to the substrate before the step of encapsulating the substrate such that the electrical connection extends through the opaque material.

5. The method of claim 1, wherein the step of encapsulating the substrate comprises overmolding the opaque material around the substrate.

6. The method of claim 1, wherein the step of encapsulating the substrate comprises transfer molding the opaque material around the substrate.

7. The method of claim 1, wherein the radiation-transmissive material conducts infrared radiation.

8. A method of making a semiconductor device, comprising:

a. providing a substrate having an electrical circuit formed on one sides thereof, said circuit including optically active electrical components;

b. encapsulating each optically active component with an optical medium;

c. attaching an electrical connection to the circuit on the substrate; and d. encapsulating the substrate with an opaque material disposed over the substrate and the encapsulated electrical components, said opaque material sealing the substrate and the circuit from the outside environment so that light is not emitted to or received from said outside environment, said electrical connection extending through the opaque material to enable electrical contact with the electrical components.

9. The method of claim 8, wherein the step of encapsulating each optically active component with an optical medium is carried out before the optically active components are mounted on the substrate and connected in the circuit.

10. The method of claim 8, wherein at least one optically active component comprises a photo-emitter and photo-detector operating in combination as an optocoupler.

11. The method of claim 8, wherein the optical medium comprises a light conducting material coated with a light reflective material.

12. The method of claim 11, wherein the light conducting material comprises silicone resin.

13. The method of claim 8, wherein the optical medium conducts infrared radiation.

14. The method of claim 8, wherein the step of attaching an electrical connection comprises the step of mechanically connecting a lead frame to the substrate and electrically connecting the lead frame to the respective circuit components.

15. The method of claim 8, wherein the step of encapsulating the substrate comprises overmolding the opaque material around the substrate.

16. The method of claim 8, wherein the step of encapsulating the substrate comprises transfer molding the opaque material around the substrate.

* * * * *